United States Patent [19]

Goodwin

[11] 4,053,914
[45] Oct. 11, 1977

[54] LIGHT EMISSIVE DIODE

[75] Inventor: Anthony Richard Goodwin, Great Dunmow, England

[73] Assignee: ITT Industries, Inc., New York, N.Y.

[21] Appl. No.: 611,727

[22] Filed: Sept. 9, 1975

[30] Foreign Application Priority Data

Oct. 3, 1974   United Kingdom .............. 42947/74

[51] Int. Cl.² ............................................ H01L 33/00
[52] U.S. Cl. ........................................ 357/17; 357/18; 357/56
[58] Field of Search ................................... 357/17–19, 357/56; 250/552, 553

[56] References Cited

U.S. PATENT DOCUMENTS

| 3,462,605 | 8/1969 | Engeler | 250/211 J |
|---|---|---|---|
| 3,691,476 | 9/1972 | Hayashi | 331/94.5 |
| 3,699,407 | 10/1972 | Gurtler et al. | 250/211 J |
| 3,813,587 | 5/1974 | Umeda et al. | 357/17 |
| 3,821,775 | 6/1974 | Biard | 357/17 |
| 3,900,863 | 8/1975 | Kim | 357/17 |
| 3,996,492 | 12/1976 | McGroddy | 313/500 |

Primary Examiner—Martin H. Edlow
Attorney, Agent, or Firm—John T. O'Halloran; Peter C. Van Der Sluys; Richard A. Menelly

[57] ABSTRACT

A high radiance light emissive diode has a linear drive-/output characteristic by providing the active region in a mesa structure with tapering sides so that super-radiant light emitted parallel with the junction is reflected and combined with the sublinear component emitted normal to the junction.

6 Claims, 3 Drawing Figures

LIGHT EMISSIVE DIODE

BACKGROUND OF THE INVENTION

Planar junction diodes having a small area contact can emit very high brightness and are therefore valuable sources for fiber optic communications at bit rates below about 100 mHz. However, they suffer from the disadvantage that if the emission takes place perpendicular to the junction the light output increases slower than linearly with drive current, whereas if the emission takes place parallel to the junction plane the line output increases faster than linearly with drive current so that in either instance the device is non-linear. This is a serious drawback for various applications, such as multiplex analogue data transmission. The cause of this non-linearity is fundamental and arises because the high carrier injection levels used create sufficient population inversion for stimulated emission to occur giving gain and therefore super-radiance for propagation in the junction plane. This super-radiance results in the light output-current input characteristic being super-linear for the component propagating in the junction plane and sub-linear for the component propagating perpendicular to the junction plane. By combining these components together in a suitable manner it is possible to achieve a near linear output characteristic. Combination can be achieved either externally using optical components, as described in our co-pending British Patent Application No. 18078/74 (M. M.Ramsay-12), or internally within the diode chip itself by using an appropriate geometry.

FIELD OF THE INVENTION

This invention relates to light emissive diodes.

SUMMARY OF THE INVENTION

According to the present invention there is provided a light emissive diode whose active region is located in a mesa having tapered sides inclined such that light originally propagating within the diode substantially parallel with the plane of the junction is reflected at the mesa sides to emerge substantially normally to the plane of the junction mixed with light originally propagating substantially normally to the plane of the junction, the light emerging from the diode through a surface provided with an anti-reflection coating.

There follows a description of a preferred embodiment of the invention together with an explanation of some of its characteristics. The description refers to the accompanying drawings in which:

DESCRIPTION OF THE PRIOR ART

Figure 1:
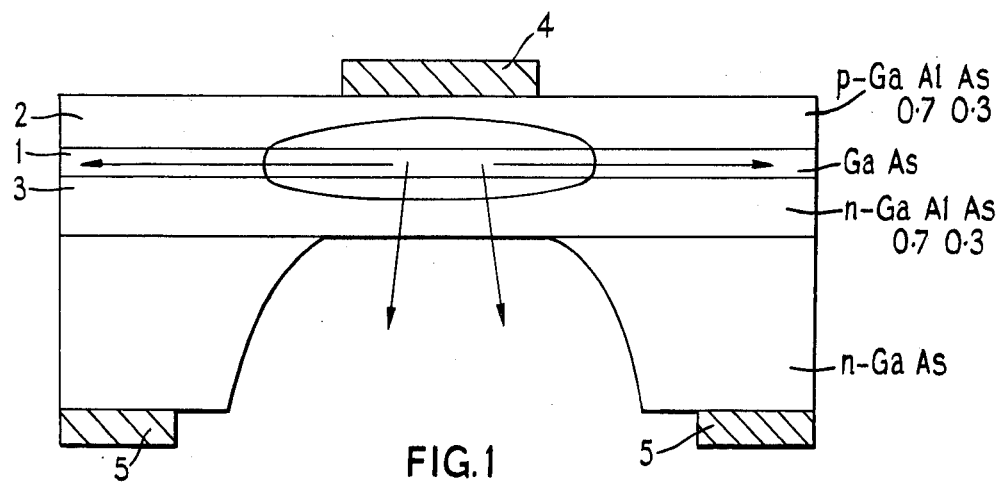
FIG. 1 depicts an enlarged sectional view of a high radiance light emissive diode.

The structure of a known GaAs high radiance diode is shown in FIG. 1 and consists of an active, or emission, layer 1 of GaAs sandwiched between p and n layers 2 and 3 which may be of GaAs or, in order to provide efficient carrier confinement and improve recombination efficiency, may be of $Ga_xAl_{1-x}As$ or other wider gap material. Contact is made by a small spot contact 4 of diameter comparable to a fiber core, typically 50 μm, on the surface closest to the junction to confine current in the junction plane, and by a ring contact 5 to allow coupling into a fiber on the other surface. As drive current through the device is increased the active region will change from absorption at low drive, through transparency at intermediate drive, to gain at high drive. Stimulated emission occurs at high gain resulting in a sub-linear variation of light output with drive current perpendicular to the junction. The effect will become important when the current is sufficient for significant gain to occur over the distance of the contact dimensions, that is at about 100 mA for a typical double heterostructure light emitting diode, and will become progressively worse as drive in increased.

DESCRIPTION OF THE PREFERRED EMBODIMENT

Figure 2:
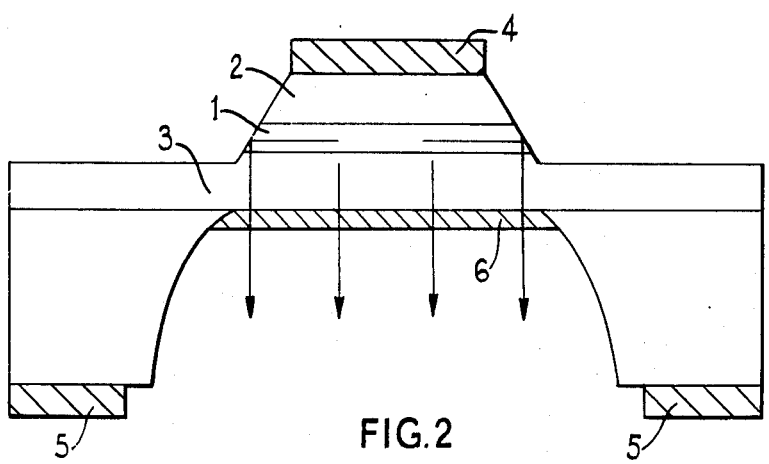
FIG. 2 depicts an enlarged sectional view of a high radiance light emissive diode according to the invention.
Figure 3:
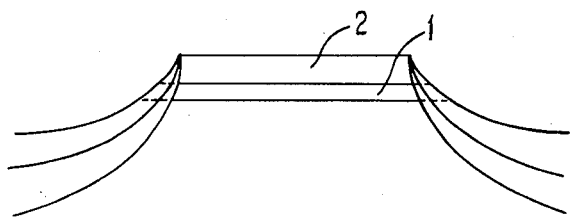
FIG. 3 shows how the profile of the mesa of the diode of FIG. 2 is modified as diffusion limited etching of its sides proceeds.

The preferred embodiment of the invention will now be described with reference to FIG. 2. The structure is essentially the same as that of the FIG. 1 device, with the difference that material has been removed from one surface of the structure down to below the active region plane so as to form a mesa with inclined edges which will reflect the radiation originally propating parallel to the junction so that this light, after reflection, emitted substantially perpendicular to the junction plane. The preferred method of forming the mesa is the use of a diffusion limited etch because this forms a well defined edge profile. Furthermore, since this profile is a function of etch depth there is the opportunity of selecting an appropriate angle for the edge of the active region by control of the etch time. The maximum output of radiation will be for a 45° edge, but it may be desirable to depart from this in order to alter the relative proportions of the two components of light to optimize linearity to suit the launching of the light into a given fiber (not shown) of a specific acceptance cone. Suitable etchants include bromine-methanol or chlorine-methanol solutions. These are not appreciably selective for GaAs against $Ga_xAl_{1-x}As$ and so there should be no significant problem with step formation at the heterojunctions. They are diffusion limited and so the mesa symmetry will be unchanged by etching. The edge profile for diffusion limited etching is a smooth variation with the angle at any given plane below the surface increasing with increasing etch time, as shown in FIG. 3. The necessary tolerance on the angle at the emergence of the active region will depend on fiber acceptance cone. The acceptance cone half angle is 11° for a typical fiber having a 1.10 refractive index ratio, indicating that tolerances of several degrees are normally adequate.

If a significant proportion of the light reflected at one mesa edge is not transmitted at the output facet but is reflected, this light is liable to be reflected at the opposite mesa edge, and thus a laser resonator is formed. To reduce this risk of laser action the output facet is provided with an anti-reflection coating 6. This will have the added advantage of increasing the power output.

It is to be understood that the foregoing description of specific examples of this invention is made by way of example only and is not to be considered as a limitation on its scope.

What is claimed is:

1. A uni-directional light emissive diode having improved linear response characteristics comprising:
    an active junction region for propagating light in a plane substantially parallel to said junction and in a plane substantially perpendicular to said junction;
    a mesa for containing said active region having a pair of top and bottom opposing surfaces and tapered sides connecting between said surfaces said tapered sides inclining toward said top surface for reflecting said parallel light in a direction perpendicular to said bottom surface and mixing said parallel light with said perpendicular light and causing said light to become uni-directional; and
    a cavity approximate said second surface for receiving one end of an optical fiber therein. whereby said uni-directional light is transmitted into said optical fiber.

2. The diode of claim 1 wherein said diode comprises a double heterostructure configuration.

3. The diode of claim 1 wherein said active region comprises a layer of GaAs.

4. The diode of claim 3 wherein said GaAs layer is sandwiched between a first and second layer of GaAlAs.

5. A uni-directional light emissive diode comprising:
    a mesa having a pair of top and bottom opposing surfaces and tapered sides;
    a light producing junction within said mesa for propagating light in a plane perpendicular to said junction and in a plane parallel to said junction;
    an anti-reflection coating on said bottom surface for reducing light reflection therefrom said bottom surface; and
    a cavity proximate said bottom surface for receiving one end of an optical fiber therein;
    whereby said light propagated parallel to said junction becomes reflected by said tapered sides in a direction substantially perpendicular to said junction and mixes with said light propagated perpendicular to said junction and becomes directed into said optical fiber end.

6. The light emissive diode of claim 5 wherein the diode comprises a double heterostructure device wherein said active region consists of GaAs and wherein said active region is sandwiched between two GaAlAs layers.

* * * * *